「12」 United States Patent
Bhuwalka et al.

(10) Patent No.: US 8,802,531 B2
(45) Date of Patent: Aug. 12, 2014

(54) SPLIT-CHANNEL TRANSISTOR AND METHODS FOR FORMING THE SAME

(71) Applicant: Taiwan Semiconductor Manufacturing Company, Ltd., Hsin-Chu (TW)

(72) Inventors: Krishna Kumar Bhuwalka, Leuven (BE); Gerben Doornbos, Leuven (BE); Matthias Passlack, Huldenberg (BE)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/078,926

(22) Filed: Nov. 13, 2013

(65) Prior Publication Data

US 2014/0065780 A1 Mar. 6, 2014

Related U.S. Application Data

(62) Division of application No. 13/307,738, filed on Nov. 30, 2011, now Pat. No. 8,604,518.

(51) Int. Cl.
*H01L 21/336* (2006.01)

(52) U.S. Cl.
USPC .................................. 438/285; 257/E21.409

(58) Field of Classification Search
USPC ........................................................ 438/285
See application file for complete search history.

(56) References Cited

U.S. PATENT DOCUMENTS 6,787,406 B1 * 9/2004 Hill et al. ...................... 438/164
6,914,277 B1 * 7/2005 Hill et al. ...................... 257/213
6,974,983 B1 * 12/2005 Hill et al. ...................... 257/292
7,129,550 B2 * 10/2006 Fujiwara et al. .............. 257/401
7,187,046 B2 * 3/2007 Wu et al. ....................... 257/412
7,719,059 B2 5/2010 Hofmann et al.
8,222,680 B2 7/2012 Lin et al.
8,471,329 B2 6/2013 Bhuwalka et al.
8,604,518 B2 12/2013 Bhuwalka et al.

(Continued)

FOREIGN PATENT DOCUMENTS

KR 1020070035492 3/2007
KR 101060279 8/2011
WO 2004038808 5/2004

OTHER PUBLICATIONS

Radosavljevic, M., et al., "Non-Planar, Multi-Gate InGaAs Quantum Well Field Effect Transistors with High-K Gate Dielectric and Ultra-Scaled Gate-to-Drain/Gate-to-Source Separation for Low Power Logic Applications," 2010 IEEE International Electron Devices Meeting (IEDM), pp. 126-129.

(Continued)

*Primary Examiner* — Lex Malsawma
(74) *Attorney, Agent, or Firm* — Slater and Matsil, L.L.P.

(57) ABSTRACT

A Fin Field-Effect Transistor (FinFET) includes a fin, which includes a channel splitter having a first bandgap, and a channel including a first portion and a second portion on opposite sidewalls of the channel splitter. The channel has a second bandgap smaller than the first bandgap. A gate electrode includes a first portion and a second portion on opposite sides of the fin. A gate insulator includes a first portion between the first portion of the gate electrode and the first portion of the channel, and a second portion between the second portion of the gate electrode and the second portion of the channel.

18 Claims, 12 Drawing Sheets

(56) References Cited

U.S. PATENT DOCUMENTS

| | | | |
|---|---|---|---|
| 2004/0075122 A1 | 4/2004 | Lin et al. | |
| 2005/0073005 A1 | 4/2005 | Nowak et al. | |
| 2006/0255410 A1* | 11/2006 | Bernstein et al. | 257/353 |
| 2007/0090416 A1* | 4/2007 | Doyle et al. | 257/288 |
| 2013/0102116 A1 | 4/2013 | Xiao et al. | |
| 2013/0134522 A1 | 5/2013 | Bhuwalka | |

OTHER PUBLICATIONS

Radosavljevic, M., et al., "Electrostatics Improvement in 3-D Tri-gate Over Ultra-Thin Body Planar InGaAs Quantum Well Field Effect Transistors with High-K Gate Dielectric and Scaled Gate-to-Drain/Gate-to-Source Separation," 2011 IEEE International Electron Devices Meeting (IEDM), #278, 3 pgs.

\* cited by examiner

SPLIT-CHANNEL TRANSISTOR AND METHODS FOR FORMING THE SAME

This application is a divisional of U.S. patent application Ser. No. 13/307,738, entitled "Split-Channel Transistor and Methods for Forming the Same," filed on Nov. 30, 2011, which application is incorporated herein by reference.

BACKGROUND

The drive currents of transistors are related to the mobility of the carriers in the channel regions of the transistors. Therefore, by increasing the mobility of the carriers, the drive currents of transistors may be improved.

III-V compound semiconductor materials have high mobility values. Accordingly, the transistors using III-V compound semiconductor materials are being researched. However, due to the narrow bandgap of the III-V compound semiconductor materials, the source-to-drain leakage currents of the resulting transistors are also high.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A Fin Field-Effect Transistor (FinFET) and the method of forming the same are provided in accordance with various embodiments. The intermediate stages of forming the FinFET are illustrated. The variations and the operation of the embodiments are discussed. Throughout the various views and illustrative embodiments, like reference numbers are used to designate like elements.

Figure 1A:
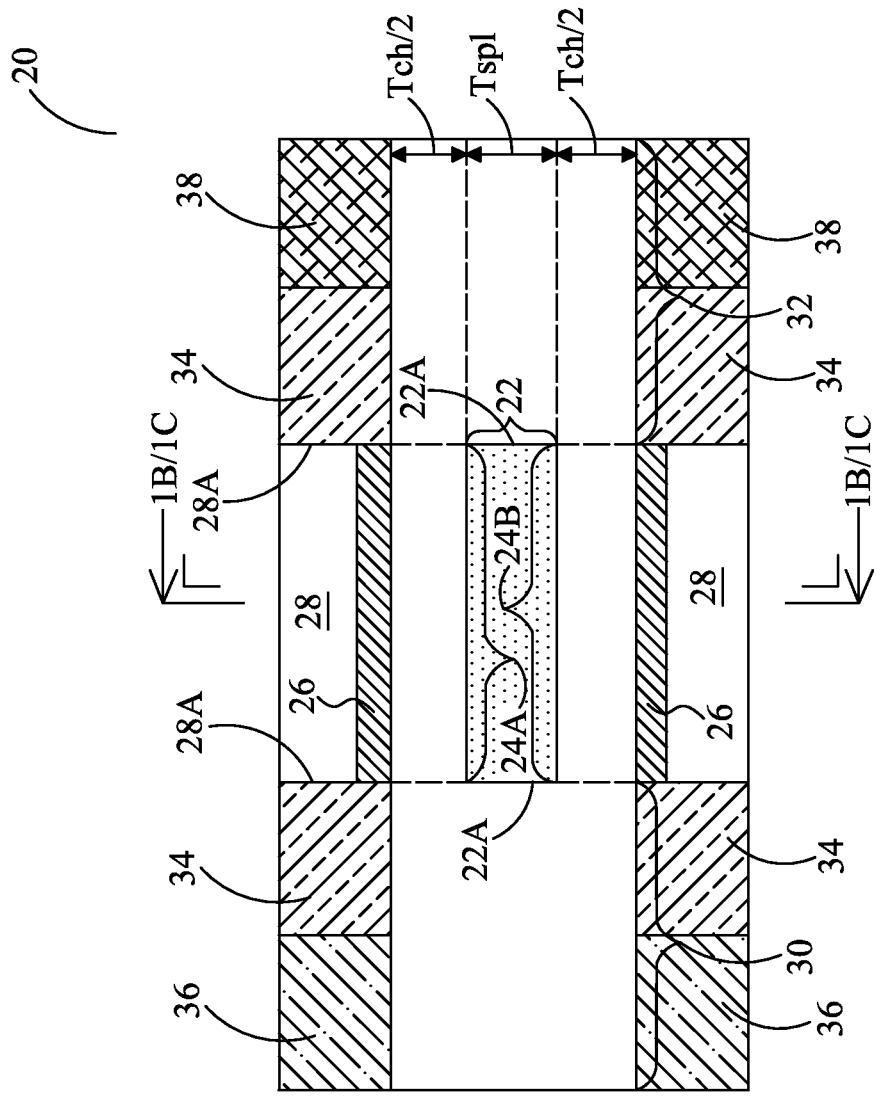
FIGS. 1A through 2 are cross-sectional views and top views of Fin Field-Effect Transistors (FinFETs) in accordance with various embodiments.

FIG. 1A illustrates a top view of exemplary FinFET 20. FinFET 20 includes channel splitter 22 that splits channel(s) 24, and hence channels 24 include portions 24A and 24B on opposite sides of channel splitter 22. Gate insulator(s) 26 separate channels 24 from gate electrode(s) 28. Drain region 30 and source region 32 are on opposite ends of channels 24 and channel splitter 24. Sidewall spacers 34 are formed on the sidewalls of gate electrode 28. Drain contact 36 and source contact 38 are electrically coupled to drain region 30 and source region 32, respectively.

Figure 1B:
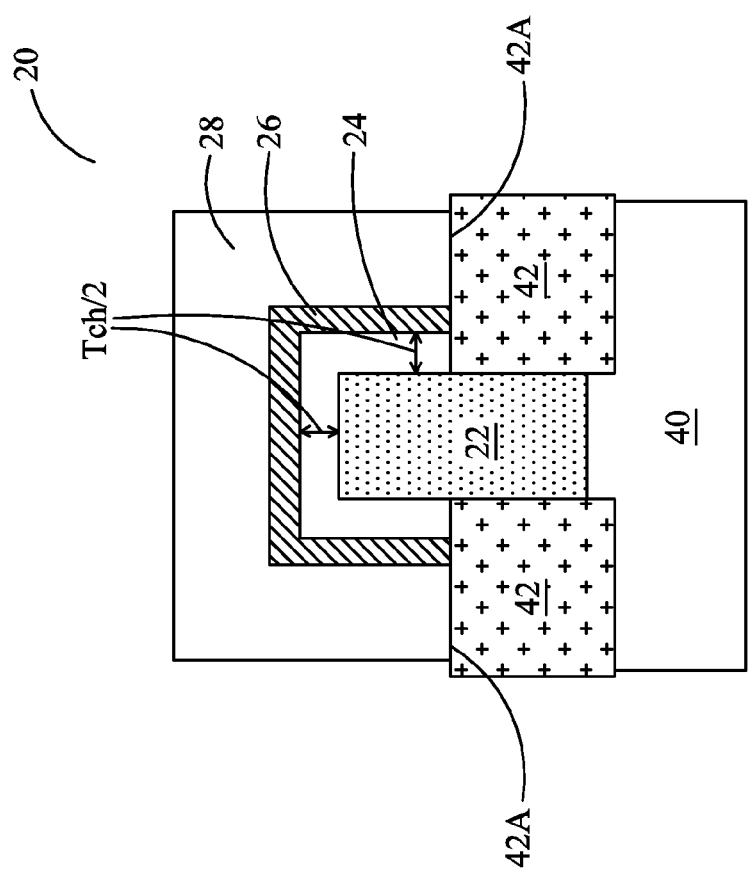

FIG. 1B illustrates a cross-sectional view of FinFET 20 in accordance with some exemplary embodiments, wherein the cross-sectional view is taken from the plane crossing line 1B/1C-1B/1C in FIG. 1A. The embodiment shown in FIG. 1B includes a tri-gate transistor. In an exemplary embodiment, FinFET 20 is formed over substrate 40, which may be a silicon substrate, although it may also be other substrates (such as sapphire) that are suitable for forming III-V compound semiconductor materials. Alternatively, substrate 40 may be formed of the same material as channel splitter 22, and hence channel splitter 22 is patterned from a bulk material. Shallow Trench Isolation (STI) regions 42 may be formed over a portion of substrate 40. Channel splitter 22 may be a fin that is formed over top surfaces 42A of STI regions 42. Channels 24 may be formed on the top surface and sidewalls of channel splitter 22. Gate insulator 26 is formed on the top surface and sidewalls of channels 24. In some embodiments, gate insulator 26 may comprise a high-k dielectric material such as $Ta_2O_5$, HfSiO, HfSiON, $HfO_2$, $ZrO_2$, ZrSiO, ZrSiON, TaSiO, or the like. Gate electrode 28 is formed on gate insulator 26. Gate electrode 28 may comprise doped polysilicon, metals, metal silicides, or the like.

Figure 1C:
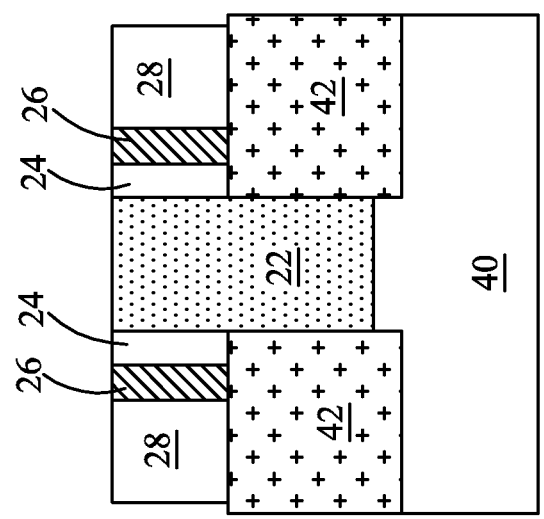

FIG. 1C illustrates a cross-sectional view of FinFET 20 in accordance with alternative embodiments, wherein the cross-sectional view is also taken from the plane crossing line 1B/1C-1B/1C in FIG. 1A. The embodiment shown in FIG. 1C includes a double-gate transistor, wherein fin 24 includes portions on sidewalls of channel splitter 22, and does not extend on the top of channel splitter 22. Furthermore, gate insulators 26 and gate electrodes 28 are formed on the opposite sides of fin 24, and may, or may not, extend to the top of channel splitter 22.

Referring back to FIG. 1A, channel 24, source region 32, and drain region 30 of FinFET 20 are formed of low-bandgap materials, which may be low-bandgap III-V compound semiconductor materials. The low-bandgap materials may have bandgaps lower than about 0.75 eV, or lower than about 0.5 eV, for example. Exemplary materials for forming channels 24, source region 32, and drain region 30 include InAs, GaSb, InSb, InGaAs, Ge, and the like. In an exemplary embodiment, InAs, which has a bandgap equal to about 0.36 eV, may be used for forming channels 24, source region 32, and/or drain region 30. Source region 32 and/or drain region 30 may be formed of a same material or different materials.

Channel splitter 22 has a bandgap greater than the bandgaps of channels 24, source region 32, and/or drain region 30. In an exemplary embodiment, the bandgap of channel splitter 22 is great than the bandgaps of channels 24, source region 32, and/or drain region 30 by greater than about 1 eV. In an exemplary embodiment, channel splitter 22 is formed of AlAsSb (such as $AlAs_{0.16}Sb_{0.84}$), which may have a bandgap equal to about 1.84 eV.

In some embodiments, for example, when FinFET 20 is an n-type FinFET, the conduction band of channel splitter 22 is higher than the conduction bands of channels 24, source region 32, and drain region 30, with the conduction band offsets ΔCB (conduction band differences) being greater than about 0.5 eV, or greater than about 1.0 eV.

In the embodiments wherein FinFET 20 is a p-type FinFET, the valence band of channel splitter 22 may also be lower than the valence bands of channels 24, source region 32, and/or drain region 30, with the valence band offset ΔVB (valence band differences) being greater than about 0.5 eV, or greater than about 1.0 eV.

Figure 2:
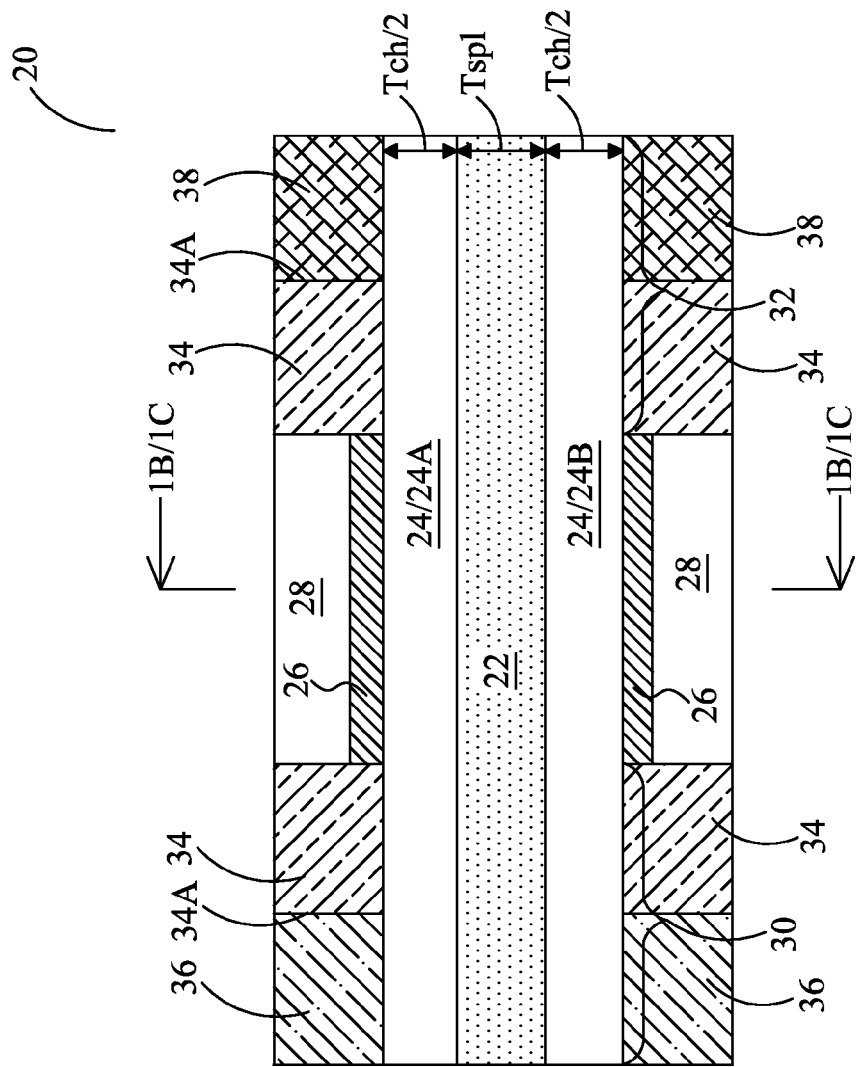

Again referring to FIG. 1A, edges 22A of channel splitter 22 may be substantially aligned to edges 28A of gate electrodes 28. Alternatively, channel splitter 22 may extend into drain region 30 and/or source region 32. FIG. 2 illustrates a top view of FinFET 20 in accordance with various alternative embodiments. The cross-sectional views of FinFET 20 in FIG. 2 may also be shown as FIGS. 1B and 1C. These embodiments are essentially the same as the embodiments as shown in FIGS. 1A, 1B, and 1C, except that channel splitter 22 extends into drain region 30 and source region 32. In some embodiments, channel splitter 22 extends beyond outer side edges 34A of sidewalls spacers 34. Channel splitter 22 may be aligned to source contacts 38 and/or drain contacts 36, and extend to between opposite sidewall portions of drain contact 36 and between opposite sidewall portions of source contact 38.

In the embodiments shown in FIGS. 1A and 2, channel 24 has total thickness Tch (which is also the total channel width). Accordingly, the thickness of each of channel portions 24A and 24B may be Tch/2. Thickness Tch/2 of channel portions 24A and 24B may be between about 2 nm and about 10 nm, or between about 3 nm and about 7 nm. Thickness Tsp1 of channel splitter 22 may be between about 5 nm and about 20 nm, or between about 8 nm and about 12 nm. It is realized, however, that the dimensions recited throughout the description are merely example, and may be changed to different values.

Figure 4:
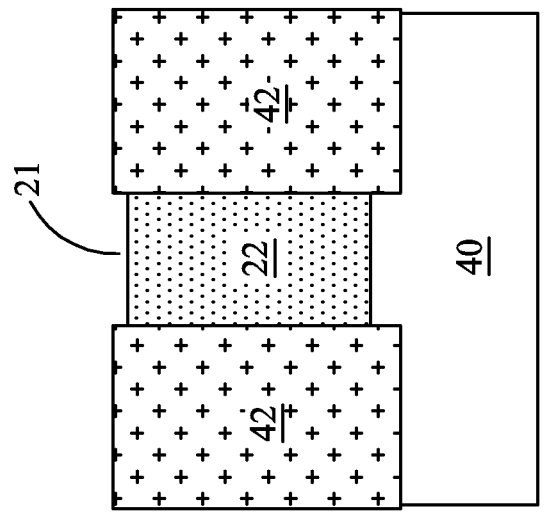
FIG. 3 through 8B are intermediate stages in the manufacturing of the FinFET shown in FIG. 2 in accordance with embodiments.
Figure 3:
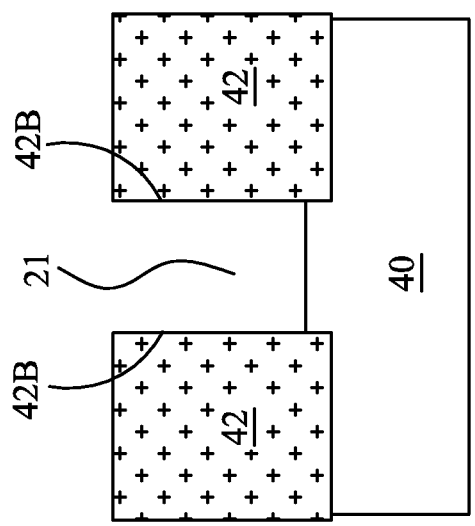

FIGS. 3 through 8B illustrate an exemplary process for forming the structure as shown in FIG. 2. Referring to FIG. 3, STI regions 42 are formed in substrate 40, wherein substrate 40 may be a silicon substrate, for example. Recess 21 is formed by removing a part of substrate 40 between opposite sidewalls 42B of STI regions 42. An epitaxial growth is then performed to epitaxially grow channel splitter 22 in recess 21, and the resulting structure is shown in FIG. 4.

Figure 5B:
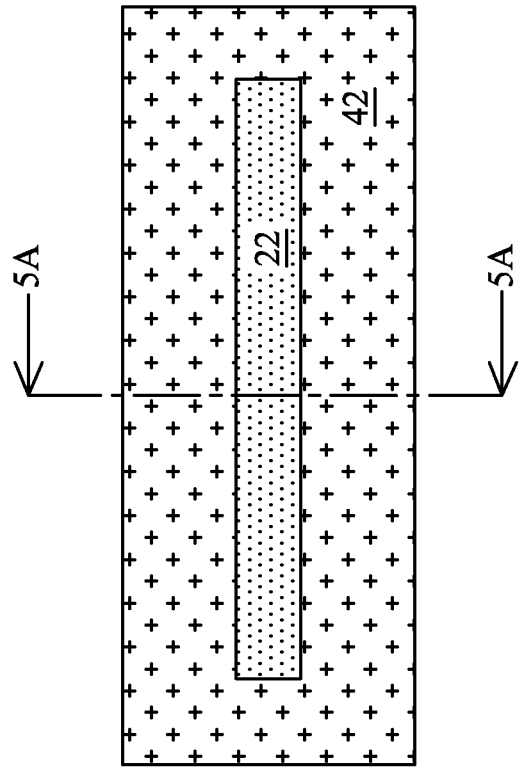
Figure 5A:
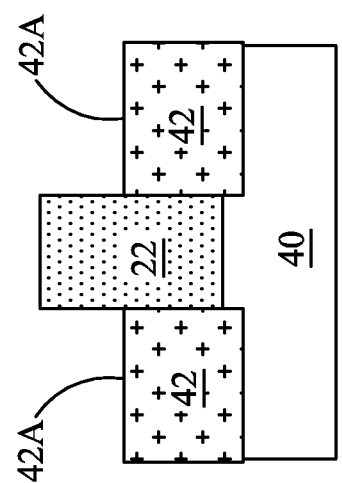

Next, as shown in FIG. 5A, top portions of STI regions 42 are removed, and top surfaces 42A of STI regions 42 are lowered. As a result, a portion of channel splitter 22 is higher than top surfaces 42A of STI regions 42. FIG. 5B illustrates a top view of the structure in FIG. 4A, wherein the cross-sectional view in FIG. 5A is obtained from the plane crossing line 5A-5A in FIG. 5B.

Figure 6:
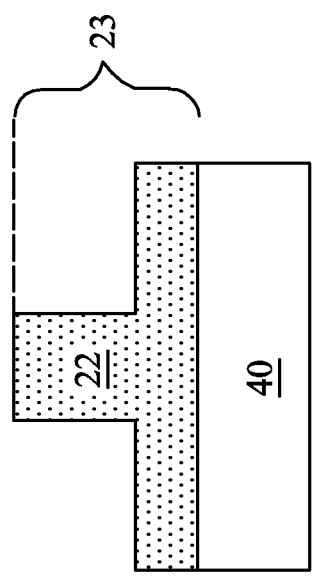

FIG. 6 illustrates an alternative embodiment, wherein channel splitter 22 is formed by patterning thick layer 23. Thick layer 23 may comprise the same material as channel splitter 22. Although substrate 40 is illustrated as being underlying layer 23, in alternative embodiments, channel splitter 22 may be patterned from a bulk material. In which embodiments, there is no substrate 40 underlying layer 23, and layer 23 is a bulk substrate.

Figure 7B:
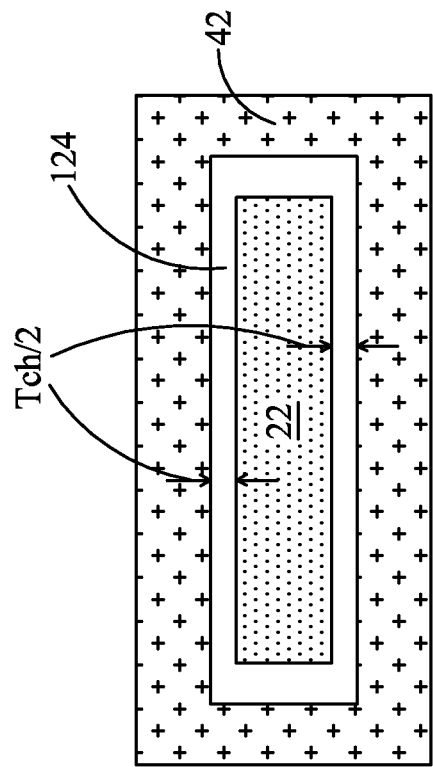
Figure 7A:
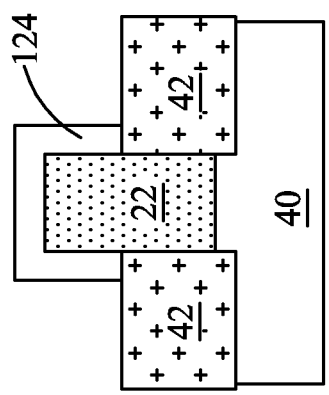

In a subsequent process step, as shown in FIGS. 7A and 7B, an epitaxy is performed to epitaxially grow narrow-bandgap material 124 on the top surface and sidewalls of channel splitter 22. FIG. 7B illustrates a top view of the structure shown in FIG. 7A. Since narrow-bandgap material 124 is formed by epitaxy, the thickness Tch/2 of narrow-bandgap material 124 may be controlled to be, for example, smaller than about 2 nm, or between about 1 nm and about 3 nm.

Figure 8B:
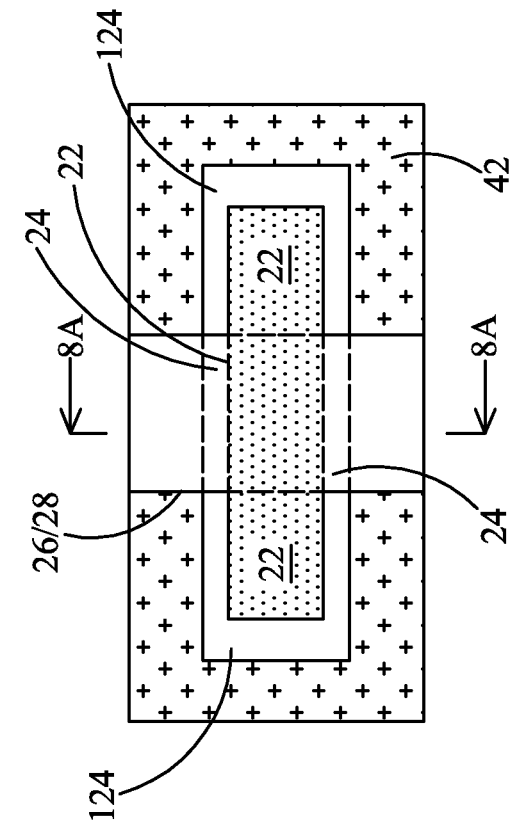
Figure 8A:
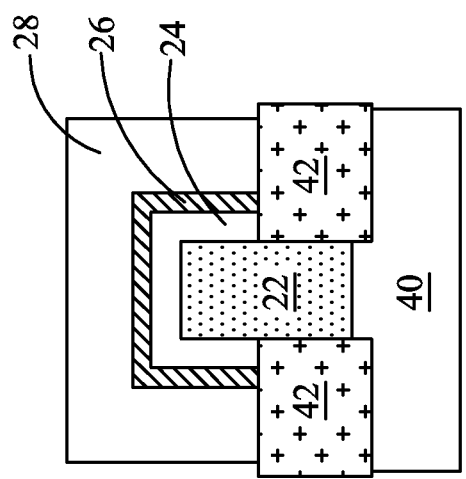

FIGS. 8A and 8B illustrate a cross-sectional view and a top view, respectively, of the formation of gate insulator 26 and gate electrode 28. The cross-sectional view in FIG. 8A is obtained from the plane crossing line 8A-8A in FIG. 8B. The formation process may include forming a blanket dielectric layer over the structure in FIGS. 7A and 7B, forming a blanket gate electrode layer over the blanket dielectric layer, and then patterning the blanket dielectric layer and the blanket gate electrode layer to form gate insulator 26 and gate electrode 28, respectively. The portions of narrow-bandgap material 124 covered by gate electrode 28 thus form channel (s) 24 as shown in FIGS. 1A and 2. In subsequent process steps, as shown in FIG. 2A, sidewall spacers 34, drain region 30, source region 32, drain contact 36, and source contact 38 are formed. Sidewall spacers 34 may be formed first by depositing a dielectric layer(s), and then performing an anisotropic etch on the dielectric layer. Drain region 30 and source region 32 are then formed by implanting an impurity into portions of channel splitter 22 and narrow-bandgap material 124 (FIG. 8B), which portions are not covered by gate electrode 28. In subsequent steps, inter-layer dielectric (ILD, not shown), drain contact 36, and source contact 38 (FIG. 2) that are in the ILD are formed.

Figure 10:
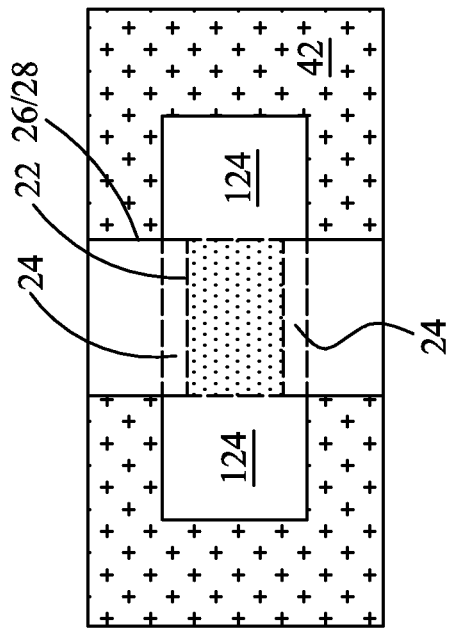
FIGS. 9 and 10 are intermediate stages in the manufacturing of the FinFET shown in FIG. 1A in accordance with embodiments.
Figure 9:
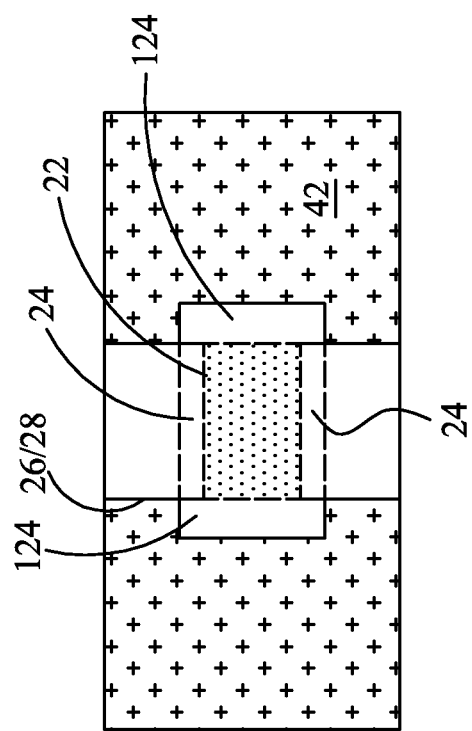

FIGS. 9 and 10 illustrate cross-sectional views of intermediate stages in the formation of the FinFET 20 as in FIG. 1A. The initial process steps are essentially the same as what are shown in FIGS. 3 through 7B. Next, the structure as shown in FIG. 9 is formed. This structure is similar to the structure in the step shown in FIG. 8B, except gate electrode 28 may cover substantially an entirety of channel splitter 22. Next, as shown in FIG. 10, before the formation of sidewall spacers 34, an epitaxy is performed to expand narrow-bandgap material 124, wherein the expanded portions of narrow-bandgap material 124 are selectively grown starting from the exposed portions of narrow-bandgap material 124 in FIG. 9. The expanded portions of narrow-bandgap material 124 may comprise the same III-V compound semiconductor material as the original narrow-bandgap material 124 in FIG. 9. Alternatively, the expanded portions of narrow-bandgap material 124 may comprise different III-V compound semiconductor materials than the original narrow-bandgap material 124 in FIG. 9.

Next, similar to what are shown in FIG. 1A, sidewall spacers 34 are formed. An implantation is then performed to dope an impurity into drain region 30 and source region 32 to p-type or n-type, depending on whether the resulting FinFET 20 is a p-type FinFET or an n-type FinFET. Drain contact 36 and source contact 38 are then formed. Please note that the resulting FinFET is similar to FinFET 20 shown in FIG. 1A, except that drain region 30 and source region 32 may be wider in the channel-width direction.

Figure 11:
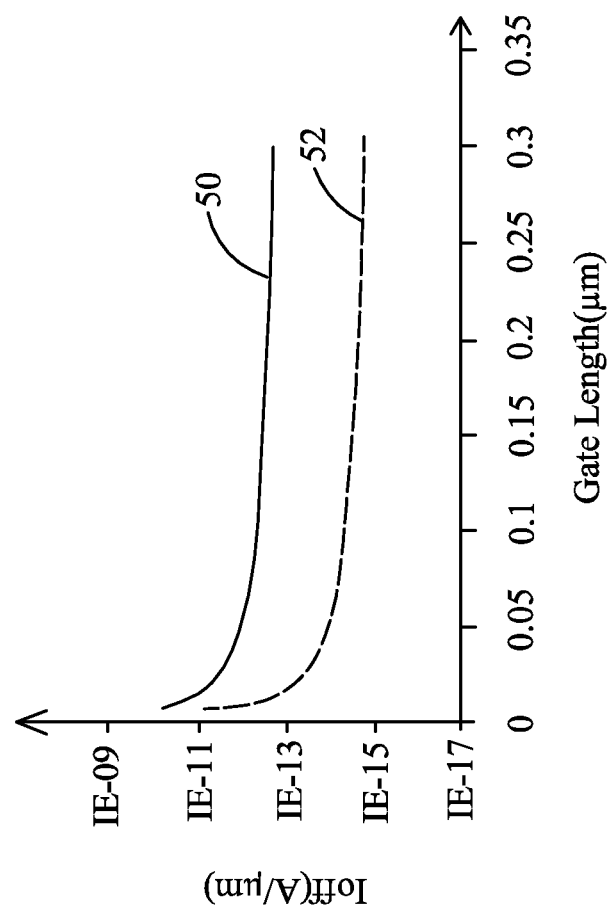
FIG. 11 illustrates leakages currents of FinFETs as a function of gate lengths.

Through the formation of channel splitter 22, which has a greater bandgap than channel 24, the leakage current Ioff of the resulting FinFET 20 may be reduced. FIG. 11 illustrates the simulation results, wherein the leakage currents Ioff of FinFETs are illustrated as a function of gate lengths. Line 50 is obtained by simulating the device behavior of a FinFET with a homogenous channel comprising InAs, while line 52 is obtained by simulating the device behavior of FinFET comprising channel splitter 22. Channel splitter 22 comprises $AlAs_{0.16}Sb_{0.84}$, and is disposed between channels formed of InAs. It is observed that by forming channel splitter 22, leakage currents Ioff may be reduced by about 2 orders compared to the FinFET with the homogenous InAs channel.

Figure 12:
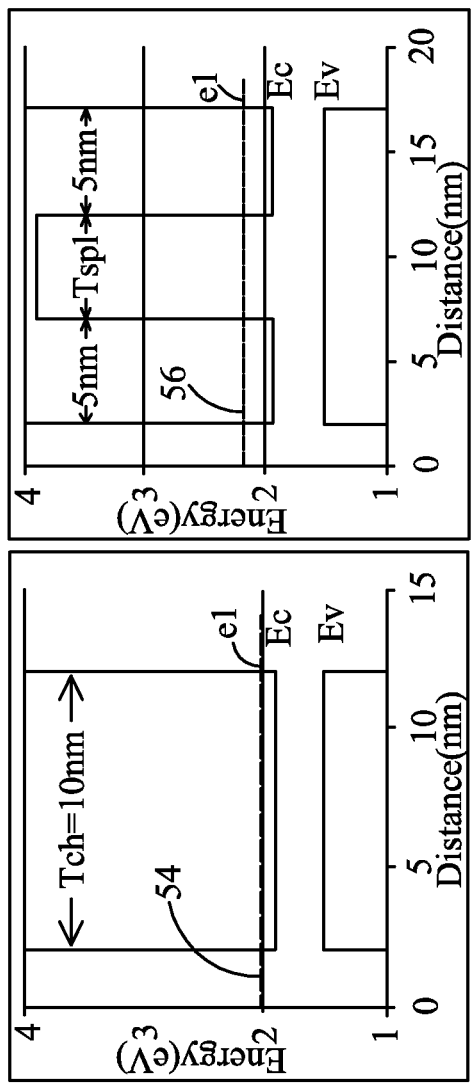
FIG. 12 illustrates the comparison of energy band diagrams of the FinFETs with splitter and the FinFETs without splitter.

FIG. 12 illustrates the comparison of energy band diagrams, wherein the energy band diagram of a first FinFET having a homogenous InAs channel (without channel splitter) and a second FinFET having a hetero junction channel comprising $AlAs_{0.16}Sb_{0.84}$ channel splitter between InAs channels are compared. The Y-axis indicates the energy level, and the X-axis indicates the distance measured from the top to the bottom of the gate. The energy band diagram on the left is obtained from the first FinFET, while the energy band diagram on the right is obtained from the second FinFET. The first and the second FinFETs have the same 10 nm InAs channel thickness (channel width), except the second FinFET has the channel splitter with thickness Tsp1 inserted to the middle of its channel. Line 54 illustrates the level (e1) of the first electronic state in the first FinFET, and line 56 illustrates the level of the first electronic state in the second FinFET. It is appreciated that the e1 level indicated by line 56 is about 130 meV higher than the e1 level indicated by line 54, which increased e1 level contributes to the reduction in the source-to-drain leakage currents Ioff in the resulting second FinFET. In addition, simulation results also indicated that the energy state (such as the illustrated e1 level 56) is not impacted by the thickness Tsp1 of the channel splitter. Therefore, the performance of the resulting FinFET is stable, and is not affected by the variation in the thickness Tsp1 of the channel splitter.

In accordance with embodiments, a FinFET includes a fin, which includes a channel splitter having a first bandgap, and a channel including a first portion and a second portion on opposite sidewalls of the channel splitter. The channel has a second bandgap smaller than the first bandgap. A gate electrode includes a first portion and a second portion on opposite sides of the fin. A gate insulator includes a first portion between the first portion of the gate electrode and the first portion of the channel, and a second portion between the second portion of the gate electrode and the second portion of the channel.

In accordance with other embodiments, a FinFET includes a fin including a first III-V compound semiconductor material having a first bandgap, and a second III-V compound semiconductor material on a top surface and opposite sidewalls of the first III-V compound semiconductor material. The second III-V compound semiconductor material has a second bandgap different from the first bandgap. A gate insulator is on a top surface and sidewalls of the fin, wherein the gate insulator covers a portion of the fin. A gate electrode is over the gate insulator. The FinFET further includes a drain region and a source region, wherein the drain region and the source region are connected to opposite ends of the fin. Each of the drain region and the source region includes a first portion having a bandgap different from the first bandgap.

In accordance with yet other embodiments, a method includes forming a first III-V compound semiconductor material, and epitaxially growing a second III-V compound semiconductor material on a top surface and sidewalls of the first III-V compound semiconductor material. The second III-V compound semiconductor material has a bandgap smaller that a bandgap of the first III-V compound semiconductor material. A gate insulator is formed on sidewalls of the second first III-V compound semiconductor material. A gate electrode is formed on the gate insulator.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
    forming a second semiconductor material on a top surface and sidewalls of a first semiconductor material, wherein the first semiconductor material has a first bandgap, and the second semiconductor material has a second bandgap smaller that the first bandgap;
    forming a gate insulator on sidewalls of the second semiconductor material, wherein the gate insulator overlaps substantially an entirety of the first semiconductor material;
    forming a gate electrode on the gate insulator; and
    forming a drain region and a source region, wherein the drain region and the source region are substantially free from the first semiconductor material.

2. The method of claim 1, wherein the gate insulator overlaps a middle portion of the first semiconductor material, and wherein the method further comprises:
    forming a drain region and a source region, wherein each of the drain region and the source region comprises a portion of the first semiconductor material and the second semiconductor material.

3. The method of claim 2 further comprising forming a drain contact and a source contact electrically coupled to the drain region and the source region, respectively, wherein the first semiconductor material extends between opposite sidewall portions of the drain contact and between opposite sidewall portions of the source contact.

4. The method of claim 1 further comprising epitaxially growing the first semiconductor material.

5. The method of claim 1, wherein the first bandgap is greater than the second bandgap by more than about 0.5 eV.

6. The method of claim 1, wherein the first semiconductor material is AlAsSb, and wherein the second semiconductor material is InAs.

7. The method of claim 1, wherein the step of forming the first semiconductor material comprises a lithography step.

8. The method of claim 1, wherein the forming the second semiconductor material comprises epitaxially growing the second semiconductor material from the first semiconductor material.

9. A method comprising:
    removing a portion of a semiconductor substrate between Shallow Trench Isolation (STI) regions to form a recess;
    epitaxially growing a first III-V compound semiconductor material in the recess;
    recessing the STI regions, wherein a portion of the first III-V compound semiconductor material forms a fin protruding above top surfaces of the STI regions, with the first III-V compound semiconductor material having a first bandgap;
    epitaxially growing a second III-V compound semiconductor material on sidewalls of the first III-V compound semiconductor material, with the second III-V compound semiconductor material having a second bandgap smaller that the first bandgap;
    forming a gate insulator on sidewalls of the second III-V compound semiconductor material; and
    forming a gate electrode over the gate insulator.

10. The method of claim 9, wherein the gate insulator and the gate electrode are formed on a middle portion of the second III-V compound semiconductor material, and wherein the method further comprises:

forming source and drain regions in end portions of the second III-V compound semiconductor material un-covered by the gate insulator.

11. The method of claim 9 further comprising, after the forming the gate insulator and the gate electrode, epitaxially growing source and drain regions from end surfaces of the first III-V compound semiconductor material and the second III-V compound semiconductor material.

12. The method of claim 9 further comprising, when epitaxially growing the second III-V compound semiconductor material on sidewalls of the first III-V compound semiconductor material, simultaneously epitaxially growing the second III-V compound semiconductor material on a top surface of the first III-V compound semiconductor material.

13. The method of claim 9, wherein the first bandgap is greater than the second bandgap by more than about 0.5 eV.

14. The method of claim 13, wherein the first bandgap is greater than the second bandgap by more than about 1.0 eV.

15. The method of claim 13, wherein the first III-V compound semiconductor material comprises AlAsSb, and wherein the second III-V compound semiconductor material comprises a material selected from the group consisting essentially of InAs, GaSb, InSb, and InGaAs.

16. A method comprising:
    forming a semiconductor fin comprising a first III-V compound semiconductor material having a first bandgap, wherein the forming the semiconductor fin comprises:
        removing a portion of a semiconductor substrate between Shallow Trench Isolation (STI) regions to form a recess;
        epitaxially growing the first III-V compound semiconductor material in the recess; and
        recessing the STI regions;
    growing a second III-V compound semiconductor material on a top surface and sidewalls of the first III-V compound semiconductor material, with the second III-V compound semiconductor material having a second bandgap smaller that the first bandgap;
    forming a gate insulator over a middle portion of the first and the second III-V compound semiconductor materials;
    forming a gate electrode over the gate insulator; and
    doping end portions of the first III-V compound semiconductor material and the second III-V compound semiconductor material with impurities to form source and drain regions.

17. The method of claim 16, wherein the growing the second III-V compound semiconductor material comprises an epitaxy.

18. The method of claim 16, wherein the first III-V compound semiconductor material and the second III-V compound semiconductor material comprise III-V compound semiconductor materials.

* * * * *